AMPLITUDE COMPARATOR

Filed Nov. 1, 1961

3 Sheets-Sheet 1

INVENTORS.
MARTIN FISCHMAN
WILLIAM GELLER
BY
R. J. Frank
ATTORNEY

INVENTORS.
MARTIN FISCHMAN
WILLIAM GELLER
BY R. J. Frank
ATTORNEY

INVENTORS.
MARTIN FISCHMAN
WILLIAM GELLER
BY R. J. Frank
ATTORNEY

United States Patent Office 3,098,162

Patented July 16, 1963

3,098,162

AMPLITUDE COMPARATOR

Martin Fischman, Wantagh, and William Geller, Plainview, N.Y., assignors to General Telephone and Electronics Laboratories, Inc., a corporation of Delaware Filed Nov. 1, 1961, Ser. No. 149,238
6 Claims. (Cl. 307—88.5)

This invention relates to amplitude comparison circuits and in particular to circuits for determining when the amplitude of an input signal exceeds a predetermined minimum value.

In electronic control systems, a circuit is often required which will produce a uniform output pulse whenever the amplitude of an input signal exceeds a predetermined minimum threshold value. Ideally, such a circuit would have a highly stable threshold value, would be sensitive to small signals without overloading on large signals, and would produce a high power output pulse of uniform amplitude and width. We have invented an improved amplitude comparison circuit in which a tunnel diode is used in combination with a transistor and a transformer to provide these characteristics.

It is an object of our invention to provide an improved amplitude comparison circuit which responds to extremely small signals yet has sufficient dynamic range to prevent overloading by large signals.

Another object of the invention is to provide an amplitude comparison circuit which has a definite threshold value that is relatively unaffected by changes in temperature and other ambient conditions.

Still another object is to provide an amplitude comparison circuit which may be adjusted to produce output pulses for a wide range of minimum signal inputs.

Yet another object is to provide an amplitude comparison circuit which produces a pulse of constant width and amplitude whenever the amplitude of the applied signals exceeds the threshold value.

A further object is to provide an amplitude comparison circuit which responds to input pulses having steep leading and trailing edges and having high repetition rates.

In accordance with the present invention, an amplitude comparison circuit is provided which comprises a tunnel diode having first and second electrodes, a transistor having first, second and third electrodes, and a transformer having at least first and second electromagnetically coupled windings. The first electrode of the tunnel diode is coupled to the first electrode of the transistor, the second electrode of the tunnel diode is coupled through the first winding of the transformer to the second electrode of the transistor, and the third electrode of the transistor is coupled through the second winding of the transformer to a source of direct voltage. Input signals are applied across the tunnel diode and output pulses are produced across the transformer windings.

The tunnel diode used in this circuit consists of a narrow, highly doped semiconductor p-n junction having first and second electrodes secured to opposite sides of the junction. When a voltage source is connected across the two electrodes and the voltage gradually increased in value with the proper polarity, the current through the diode increases to a peak or threshold value, then decreases to a minimum along the negative conductance portion of the characteristic, and finally rises steeply with further increases in voltage. The minimum current which flows through the tunnel diode is known as the valley current and the U-shaped portion of the current-voltage characteristic in which the slope changes from negative to positive may be defined as the valley region. When the voltage across the diode is increased from zero with the opposite polarity, the current increases without encountering a negative conductance region. The peak current value and the negative conductance portion of the characteristic are very stable and are substantially insensitive to changes in temperature.

The tunnel diode and the transistor are selected so that the current flowing between the first and second electrodes of the transistor is greater than the tunnel diode current only when the voltage across the tunnel diode corresponds to the diode valley region. Consequently, when a relatively small or a relatively large voltage is applied across the tunnel diode most of the current flows through the diode. However, when the magnitude and polarity of the applied voltage is such as to fall within the valley region of the diode most of the current flows through the transistor.

In one embodiment of the invention, the first electrode of the tunnel diode is coupled to the emitter of the transistor and the second electrode of the tunnel diode is coupled to the base of the transistor through one winding of the transformer. The collector of the transistor is connected in series with a second winding of the transformer, a source of direct voltage, and the emitter. In addition, an output winding may be provided on the transformer.

The magnitude of the input signal required to reach the threshold value of the circuit is determined by the magnitude of a D.-C. bias current which flows through the tunnel diode. This signal will be defined as the minimum triggering current and is equal to the difference between the threshold, or peak, current and the bias current. The bias current is always smaller than the peak current through the tunnel diode, the smaller the difference between the peak current and the bias current, the greater being the sensitivity of the circuit. When signal currents having a magnitude smaller than the difference between the peak and bias currents are applied to the circuit, substantially all of the current flows through the tunnel diode. With this input, the current in the base circuit of the transistor is essentially zero and no output pulse is produced by the circuit. However, when the magnitude of the signal current is greater than the difference between the peak and bias currents, the current through the tunnel diode falls to a low value while the current through the base circuit of the transistor increases to a value exceeding that through the diode. As a result, current flows through the transformer windings in the base and collector circuits of the transistor producing regenerative feedback and a single output pulse.

The input current pulse must flow in the direction which will drive the tunnel diode into its negative conductance region to produce an output pulse. If the input current flow is in the opposite direction, no output pulse is obtained.

In certain applications, such as analog to digital encoders employing feedback, the circuit may be used to determine the amplitude of an input signal by comparing its amplitude with that of a programmed series of variable amplitude reference pulses. When the sum of the currents produced by the signal and reference pulses is greater than the difference between the threshold and bias currents, an output pulse is produced; when this sum is less than the difference between the threshold and bias currents, no output pulse is generated.

The above objects of and the brief introduction to the present invention will be more fully understood and further objects and advantages will become apparent from a study of the following description in connection with the drawings, wherein.

Figure 1:
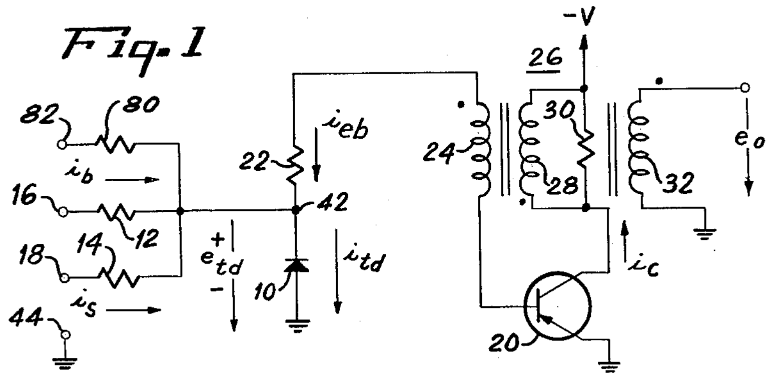
FIG. 1 is a schematic diagram of one form of the invention.

Referring to FIG. 1, there is shown a tunnel diode 10 having a first electrode connected to ground and a second electrode coupled through resistors 12 and 14 to input terminals 16 and 18 respectively. A type PNP transistor 20 has its emitter connected to the first electrode of the tunnel diode by means of a grounded connection, its base coupled to the second electrode of the tunnel diode through a resistor 22 and the primary winding 24 of a transformer 26, and its collector connected to a source of negative direct voltage, —V, through the secondary winding 28 of transformer 26. A damping resistor 30 is connected across winding 28. In addition, transformer 26 is provided with an output winding 32 which is inductively coupled to windings 24 and 28.

Figure 2:
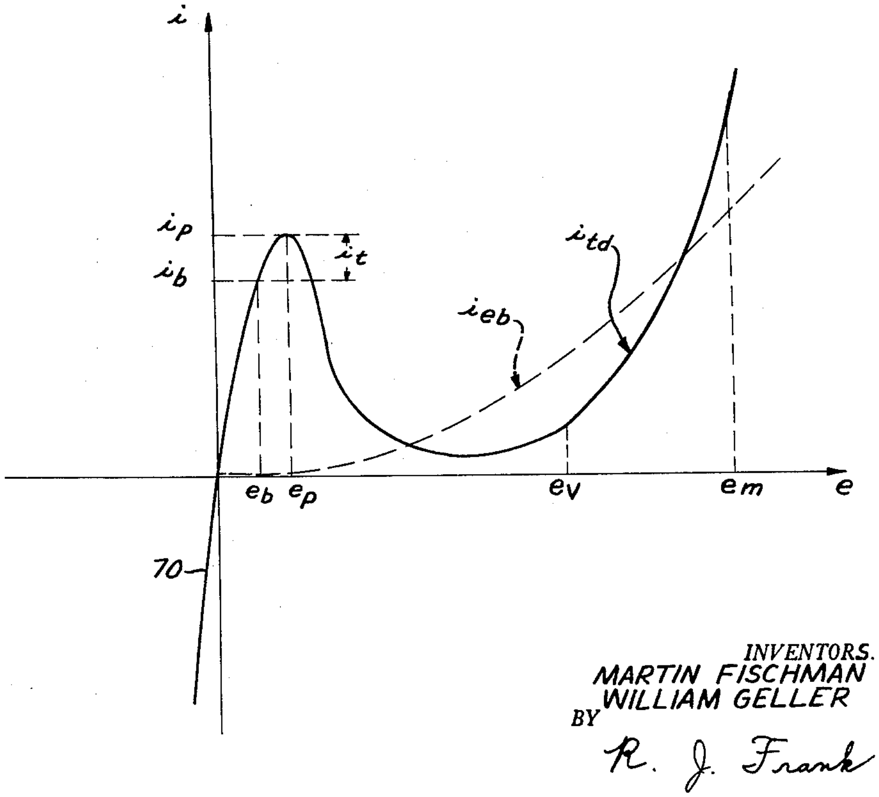
FIG. 2 is a graph showing the current-voltage characteristic curves of the tunnel diode and the transistor.

The tunnel diode static current-voltage characteristic is shown by the solid curve of the graph of FIG. 2. This curve is a plot of the current $i_{td}$ through tunnel diode 10 as a function of the magnitude of the voltage $e_{td}$ across the diode. As illustrated, increasing the voltage $e_{td}$ causes a current $i_{td}$ to flow from junction 42 to ground. This current increases sharply to a peak or threshold value $i_p$ when $e_{td}$ is equal to $e_p$, decreases to a minimum value and then increases again as the voltage $e_{td}$ is increased still further. The negative conductance portion of the characteristic curve is caused by majority carriers traveling (or "tunneling") from one side of the p-n junction to the other.

The current $i_{eb}$ flowing from the emitter to base of transistor 20 is plotted as a function of the emitter to base voltage of the transistor by the dashed curve of FIG. 2. As shown by this curve, the current $i_{eb}$ is very small for low values of emitter to base voltage and then increases as the voltage is increased. Thus, $i_{eb}$ is less than the tunnel diode current $i_{td}$ for both low and relatively high voltages and greater than $i_{td}$ for voltages such as $e_v$ in the valley region.

FIGS. 3*a*–3*e* illustrate typical voltage and current waveforms occurring in the circuit for a given bias current $i_b$ and for applied input signal currents $i_s$ of different magnitudes. The bias current $i_b$ is obtained by connecting a low impedance D.C. voltage source between terminal 16 and grounded terminal 44. The minimum triggering current $i_t$ is the difference between the peak tunnel diode current $i_p$ and the bias current $i_b$, the smaller the value of $i_t$ the greater being the sensitivity of the circuit. A signal current having a magnitude exceeding the value $i_t$ produces an ouput pulse across transformer output winding 32 while a signal current having a magnitude less than $i_t$ results in no output pulse.

Figure 3A:
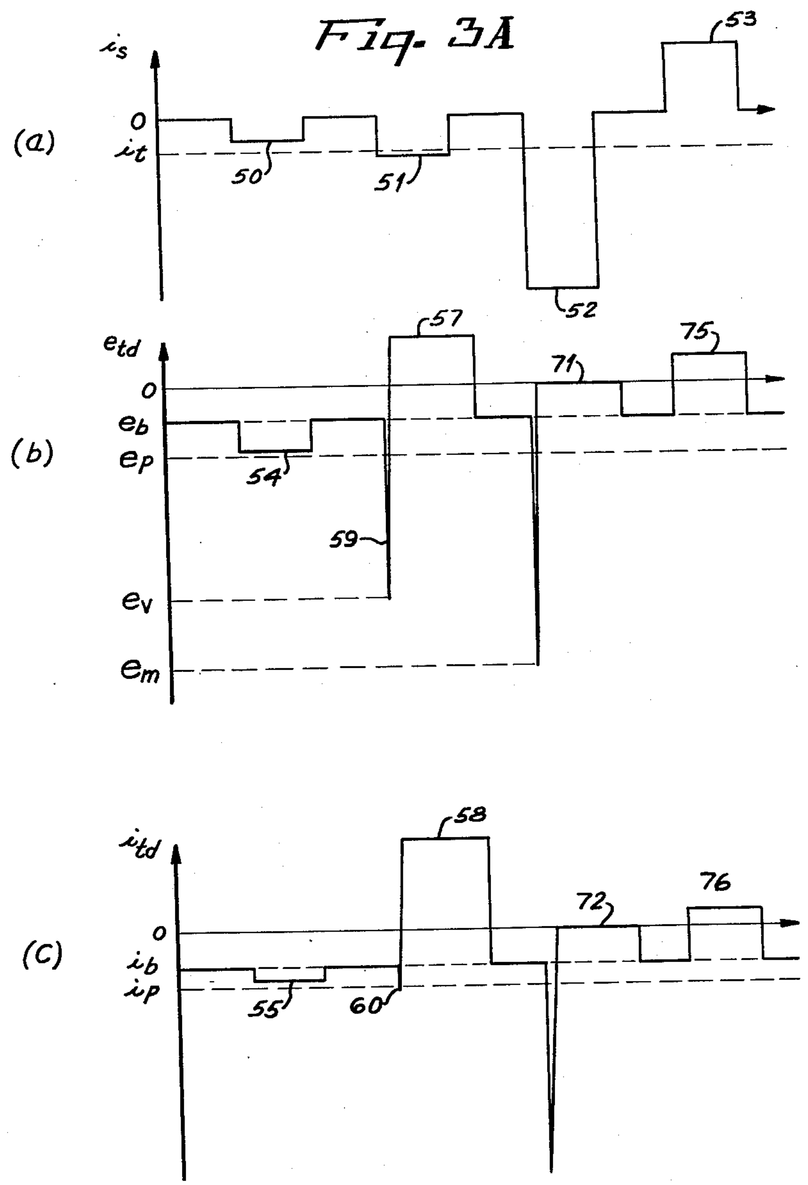
FIG. 3 illustrates typical current and voltage waveforms occurring in the circuit of FIG. 1.

FIG. 3*a* depicts the waveforms of a series of input pulses which may be applied to terminal 18. The first pulse shown has a magnitude 50 slightly less than the minimum triggering circuit $i_t$, the second pulse a magnitude 51 slightly greater than $i_t$, the third pulse 52 a magnitude equal to the maximum for which the circuit is designed, and the fourth pulse 53 is of opposite polarity to pulses 50–52. The polarity of pulses 50–52 is negative in FIG. 3*a* indicating that the current is flowing in the opposite direction from the assumed positive direction $i_s$ of FIG. 1. Similarly, the bias current $i_b$ is negative and actually flows toward terminal 16.

When only the bias current $i_b$ is applied to the circuit, the voltage across the tunnel diode 10 is equal to $e_b$, the current $i_{eb}$ in the base circuit of transistor 20 is substantially zero and the collector to emitter voltage $e_c$ is equal to —V as shown in FIGS. 3(*b*), 3(*d*), and 3(*e*) respectively. If now, a negative current pulse having a magnitude 50 (FIG. 3*a*) is applied to terminal 18 the voltage across the tunnel diode increases slightly to a magnitude 54 between $e_b$ and $e_p$, the current through the diode increases slightly to a value 55 between $i_b$ and $i_p$, while the base current of the transistor and the transistor collector voltage remain substantially constant. Thus, no output pulse is produced across output winding 32.

On the other hand, when a current pulse 51 having a magnitude slightly greater than $i_t$ is applied to terminal 18, the current flowing into junction 42 through resistor 14 exceeds the peak tunnel diode current $i_p$. As a result, the voltage $e_{td}$ across the diode increases to a higher value, such as $e_v$, the current through the diode decreases and most of the input current flows in the emitter-base circuit of the transistor, as shown at 56 in FIG. 3(*d*). This transfer of current from the diode 10 to the transistor 20 occurs because the base current $i_{eb}$ of the transistor is higher than the diode current $i_{td}$ at the voltage $e_v$.

The flow of current $i_{eb}$ in the transistor produces a positive voltage 57 across diode 10 and a positive current 58 (from junction 42 to ground) through the diode. The negative voltage and current spikes 59 and 60 respectively are due to the finite time required for the transistor to begin conducting.

Windings 24 and 28 of transformer 26 provide regenerative feedback from the collector to the base of transistor 20 upon initiation of current in the transistor. The magnitude of the feedback and the gain of the transistor are sufficient to cause the transistor current to build up rapidly and enter the saturation region of the transistor characteristic. In this region, the collector current is independent of the base current. The transistor voltages remain practically in an equilibrium state for a period of time due to the lack of dynamic gain that exists under this condition of operation. This voltage equilibrium state corresponds to the period shown at 61 and 62 of FIGS. 3(*e*) and 3(*f*) in which an output pulse is obtained across winding 32 of transformer 26. The equilibrium condition continues until the transistor operating point moves out of the saturation region into a region of high drynamic gain. A regeneration process then begins resulting in rapid turn-off of the transistor. Termination of the equilibrium condition is caused by the increasing collector current of the transistor.

The slow decay of the collector and output voltages shown at 63 and 64 of FIGS. 3(*e*) and 3(*f*) is minimized by damping resistor 30 connected across winding 28. It shall be noted that the output pulse 61 is of greater duration than the signal pulses 50–53. This insures that the circuit will generate only one output pulse for each input pulse exceeding $i_t$. Also, since the base current $i_b$ flows through the diode 10 from junction 42 to ground, the diode is operated in the region 70 having a positive slope. Thus, the circuit is reset after each input pulse having a magnitude exceeding $i_t$.

Figure 3B:
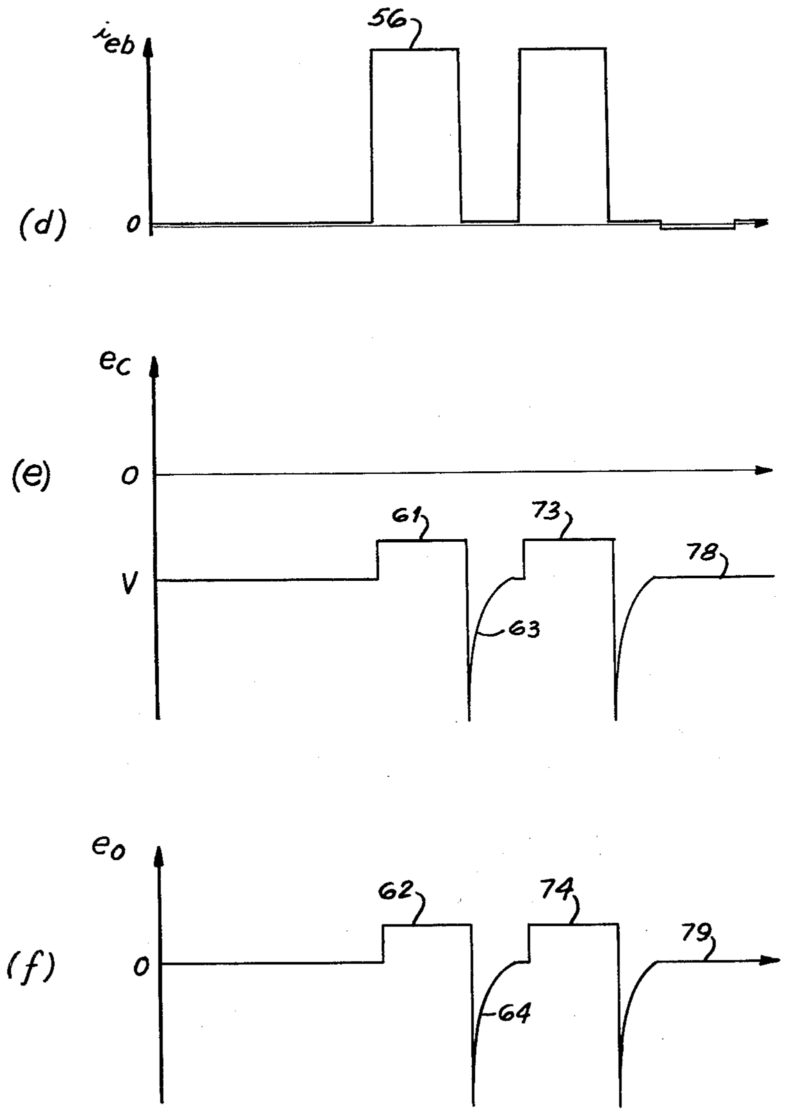

The value of resistor 22 is selected so that when a signal of maximum amplitude and negative polarity 52 is applied to the circuit, the current and voltage in the tunnel diode 10 falls to zero as shown at 71 and 72 of FIGS. 3*b* and 3*c*. The magnitude of the collector voltage 73 and output voltage 74 are identical with those produced by the smaller pulse 51.

When a pulse of opposite polarity 53 is applied to the circuit, the voltage increases along the portion 70 of the characteristic curve (FIG. 2) while the base current remains substantially at zero. This is shown at 75, 76 and 77 of FIGS. 3*b*–3*d* respectively. Thus, as indicated at 78 and 79 of FIGS. 3*e* and 3*f*, there is no output from transformer winding 32 regardless of the magnitude of the input signal 53.

In a typical circuit, resistors 12 and 14 are 2700 ohms, resistor 22 is 470 ohms, tunnel diode 10 is a type T1975 having a one milliampere peak current, transistor 20 is a type 2N711, and transformer 26 has 1:3:1 ratio for windings 24, 28, and 32 respectively.

A reference current having a polarity opposite to that of the signal current is applied to the junction 42 through a resistor 80 and terminal 82 when it is desired to use input signals having magnitudes greater than the minimum triggering current $i_t$. For example, if $i_p$ equals 1.0 milliampere and $i_b$ is set at 0.8 milliampere giving a value $i_t$ of 1.0—0.8=0.2 miliampere then, without a reference signal, any input signal greater than 0.2 milliampere will trigger the circuit to produce an output pulse. However, if a reference signal of say 3 milliamperes is applied in phase and with a polarity opposite that of the input signal, then the input signal can have any value up to 3.2 milliamperes without producing an output pulse.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. An amplitude comparison circuit comprising
(*a*) input means,
(*b*) a tunnel diode having first and second electrodes coupled to said input means,
(*c*) a transistor having first, second and third electrodes,
(*d*) a transformer having a plurality of windings, the first electrode of said tunnel diode being coupled to the first electrode of said transistor, the second electrode of said tunnel diode being coupled through a first winding of said transformer to the second electrode of said transistor, and the third electrode of said transistor being coupled through a second winding of said transformer to a source of voltage, and
(*e*) output means coupled across a winding of said transformer, an output pulse appearing across said output means when the magnitude of a signal applied to said input means exceeds a predetermined value.

2. An amplitude comparison circuit comprising
(*a*) a tunnel diode having first and second electrodes, said tunnel diode having a valley region in which the slope of the voltage-current characteristic changes from negative to positive,
(*b*) a transistor having an emitter, base and collector, the current in the base of said transistor exceeding the current through said tunnel diode only when the voltage across said tunnel diode is within said valley region,
(*c*) a transformer having a plurality of windings, the first electrode of said tunnel diode being coupled to the emitter of said transistor, the second electrode of said tunnel diode being coupled through a first winding of said transformer to the base of said transistor, and the collector of said transistor being coupled through a second winding of said transformer to a source of voltage,
(*d*) output means coupled across a winding of said transformer, and
(*e*) means for coupling an input signal to said tunnel diode, an output signal appearing across said output means when the magnitude of said input signal exceeds a predetermined value.

3. An amplitude comparison circuit comprising
(*a*) a tunnel diode having first and second electrodes, said tunnel diode having a valley region in which the slope of the voltage-current characteristic changes from negative to positive and having a peak current value,
(*b*) a transistor having an emitter, base, and collector, the current in the base of said transistor exceeding the current through said tunnel diode when the voltage across said tunnel diode is within said valley region,
(*c*) a transformer having a plurality of windings, the first electrode of said tunnel diode being coupled to the emitter of said transistor, the second electrode of said tunnel diode being coupled through a first winding of said transformer to the base of said transistor, and the collector of said transistor being coupled through a second winding of said transformer to a source of voltage,
(*d*) means for coupling an input current to said tunnel diode,
(*e*) means for coupling a bias signal to said tunnel diode, and
(*f*) output means coupled across a winding of said transformer, an output signal appearing across said output means when the magnitude of the current produced by said input signal exceeds the difference between the peak current value of said tunnel diode and the current produced by said bias signal.

4. An amplitude comparison circuit comprising
(*a*) a tunnel diode having first and second electrodes, said tunnel diode having a valley region in which the slope of the voltage-current characteristic changes from negative to positive and having a peak current value,
(*b*) a transistor having an emitter, base, and collector, the current in the base of said transistor exceeding the current through said tunnel diode when the voltage across said tunnel diode is within said valley region,
(*c*) a transformer having a plurality of windings, the first electrode of said tunnel diode being coupled to the emitter of said transistor, the second electrode of said tunnel diode being coupled through a first winding of said transformer to the base of said transistor, and the collector of said transistor being coupled through a second winding of said transformer to a source of voltage,
(*d*) means for coupling an input signal having a first polarity to said tunnel diode,
(*e*) means for coupling a reference signal to said tunnel diode, said reference signal having a polarity opposite that of said input signal, and
(*f*) output means coupled to a winding of said transformer, an output signal appearing across said output means when the magnitude of the difference between the current produced by said input and reference signals exceeds the peak current value of said tunnel diode.

5. An amplitude comparison circuit comprising
(*a*) a tunnel diode having first and second electrodes, said tunnel diode having a valley region in which the slope of the voltage-current characteristic changes from negative to positive and having a peak current value,
(*b*) a transistor having an emitter, base, and collector, the current in the base of said transistor exceeding the current through said tunnel diode when the voltage across said tunnel diode is within said valley region,
(*c*) a transformer having a plurality of windings, the first electrode of said tunnel diode being coupled to the emitter of said transistor, the second electrode of said tunnel diode being coupled through a first winding of said transformer to the base of said transistor, and the collector of said transistor being coupled through a second winding of said transformer to a source of voltage,
(*d*) means for coupling an input signal having a first polarity to said tunnel diode,
(*e*) means for coupling a reference signal to said tunnel diode, said reference signal having a polarity opposite to that of said input signal,
(*f*) means for coupling a bias signal to said tunnel diode, and
(*g*) output means coupled across a winding of said transformer, an output signal appearing across said output means when the difference between the magnitudes of the currents produced by said input signal and said reference signal exceeds the difference between the tunnel diode peak current and the current produced by said bias signal.

6. An amplitude comparison circuit comprising (a) a tunnel diode having first and second electrodes, said tunnel diode having a valley region in which the slope of the voltage-current characteristic changes from negative to positive, (b) a transistor having an emitter, base and collector, the current in the base of said transistor exceeding the current through said tunnel diode only when the voltage across said tunnel diode is within said valley region, the emitter of said transistor being coupled to the first electrode of said tunnel diode, (c) a transformer having first, second, and third windings, (d) a resistor connected in series with the first winding of said transformer, said series coupled resistor and transformer being connected between the second electrode of said tunnel diode and the base of said transistor, (e) means coupling the collector of said transistor to the second winding of said transformer, (f) resistor means for coupling applied input signals across the first and second electrodes of said tunnel diode, and (g) output means coupled across the third winding of said transformer, an output pulse of predetermined width and duration appearing across said output means when the sum of said input signals exceeds a predetermined threshold value.

References Cited in the file of this patent

UNITED STATES PATENTS 2,997,600 Hilberg et al. ____________ Aug. 22, 1961

FOREIGN PATENTS 1,249,045 France ________________ Feb. 23, 1960